(12) United States Patent
Kim

(10) Patent No.: US 11,334,205 B2
(45) Date of Patent: *May 17, 2022

(54) DISPLAY DEVICE AND METHOD OF MANUFACTURING THE SAME

(71) Applicant: Samsung Display Co., Ltd., Yongin-Si (KR)

(72) Inventor: Min Soo Kim, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/830,177

(22) Filed: Mar. 25, 2020

(65) Prior Publication Data

US 2020/0225794 A1 Jul. 16, 2020

Related U.S. Application Data

(62) Division of application No. 15/710,342, filed on Sep. 20, 2017, now Pat. No. 11,093,094.

(30) Foreign Application Priority Data

Sep. 23, 2016 (KR) ........................ 10-2016-0122292

(51) Int. Cl.
*G06F 3/041* (2006.01)
*G06F 3/044* (2006.01)
(Continued)

(52) U.S. Cl.
CPC ............ *G06F 3/0446* (2019.05); *G06F 3/045* (2013.01); *G06F 3/0412* (2013.01);
(Continued)

(58) Field of Classification Search
CPC .. G06F 3/0412; G06F 3/0414; G06F 3/04144; G06F 3/044; G06F 3/0443; G06F 3/0446; G06F 3/045; G06F 2203/04102; G06F 2203/04103; G06F 2203/04111; G06F 2203/04113; H05K 2201/05
See application file for complete search history.

(56) References Cited

U.S. PATENT DOCUMENTS 6,703,132 B1 3/2004 Yasuda et al.
8,780,074 B2 7/2014 Castillo et al.
(Continued)

FOREIGN PATENT DOCUMENTS

CN 203386194 U 1/2014
CN 103777800 A 5/2014
(Continued)

OTHER PUBLICATIONS

U.S. Office Action Report, U.S. Appl. No. 15/629,413 dated Sep. 6, 2018, 17 pages.
(Continued)

*Primary Examiner* — Ryan A Lubit
(74) *Attorney, Agent, or Firm* — Innovation Counsel LLP

(57) ABSTRACT

There are provided a display device and a method of manufacturing the same. The display device includes a display panel and a window disposed on the display panel. The window includes a first sub-window and a second sub-window and a touch sensor disposed between the first sub-window and the second sub-window.

6 Claims, 9 Drawing Sheets

(51) Int. Cl.
*G06F 3/045* (2006.01)
*H05K 1/03* (2006.01)

(52) U.S. Cl.
CPC ......... *G06F 3/0443* (2019.05); *H05K 1/0393* (2013.01); *G06F 3/04144* (2019.05); *G06F 2203/04103* (2013.01); *G06F 2203/04111* (2013.01); *H05K 2201/05* (2013.01)

(56) References Cited

U.S. PATENT DOCUMENTS

| | | | |
|---|---|---|---|
| 9,246,486 B2 | 1/2016 | Yang et al. | |
| 9,397,659 B2 | 7/2016 | Lee et al. | |
| 9,417,141 B2 | 8/2016 | Aberg et al. | |
| 9,461,645 B2 | 10/2016 | Choi | |
| 2010/0123675 A1* | 5/2010 | Ippel | G06F 3/0443 345/173 |
| 2012/0092292 A1* | 4/2012 | Hayakawa | G06F 3/0443 345/174 |
| 2013/0009905 A1 | 1/2013 | Castillo et al. | |
| 2015/0153951 A1 | 6/2015 | Kim et al. | |
| 2015/0185476 A1* | 7/2015 | Lee | G06K 9/00885 345/8 |
| 2015/0193064 A1 | 7/2015 | Lu et al. | |
| 2015/0220119 A1 | 8/2015 | Seo et al. | |
| 2016/0011689 A1 | 1/2016 | Kim et al. | |
| 2016/0195983 A1* | 7/2016 | Miyake | G06F 3/0446 345/174 |
| 2016/0299387 A1* | 10/2016 | Yamazaki | G06F 3/04164 |
| 2016/0351631 A1* | 12/2016 | Lee | H01L 51/5284 |
| 2017/0220162 A1 | 8/2017 | Ko et al. | |
| 2017/0277296 A1* | 9/2017 | Reynolds | G06F 3/0414 |
| 2017/0344152 A1* | 11/2017 | Yu | B32B 27/06 |
| 2017/0371471 A1 | 12/2017 | Kim et al. | |
| 2018/0039357 A1 | 2/2018 | Baek et al. | |
| 2018/0081481 A1* | 3/2018 | Fournier | H01M 50/20 |
| 2018/0088629 A1 | 3/2018 | Kim | |
| 2018/0088716 A1 | 3/2018 | Kim | |
| 2018/0356925 A1 | 12/2018 | Liu et al. | |

FOREIGN PATENT DOCUMENTS

| | | |
|---|---|---|
| CN | 103777825 A | 5/2014 |
| CN | 105706030 A | 6/2016 |
| KR | 1020110040453 A | 4/2011 |
| KR | 10-1679622 B1 | 12/2016 |
| KR | 10-2017-0091213 A | 8/2017 |
| KR | 10-2018-0000665 A | 1/2018 |
| KR | 10-2018-0033355 A | 4/2018 |

OTHER PUBLICATIONS

U.S. Office Action Report, U.S. Appl. No. 15/629,413 dated Feb. 12, 2019, 7 pages.
Chinese Office Action Report, Application No. 201710872439.7 dated Mar. 7, 2022, 10 pages.

* cited by examiner

DISPLAY DEVICE AND METHOD OF MANUFACTURING THE SAME

CROSS-REFERENCE TO RELATED APPLICATION

This application is a divisional application of U.S. patent application Ser. No. 15/710,342 filed on Sep. 20, 2017, now U.S. Pat. No. 11,093,094, which claims priority under 35 USC § 119 to Korean Patent Application No. 10-2016-0122292, filed on Sep. 23, 2016, in the Korean Intellectual Property Office, the entire contents of which are incorporated herein by reference in their entirety.

BACKGROUND

1. Field

An embodiment of the present inventive concept relates to a display device and a method of manufacturing the same.

2. Description of the Related Art

As interests in information displays and demands on using portable information media increase, researches and commercialization on display devices are being actively performed.

Recent display devices include touch sensors for receiving touches of users as well as image displaying functions. Therefore, users may more conveniently use the display devices through the touch sensors.

In addition, recently, various functions are provided to the users by using touch pressures as well as touch positions.

SUMMARY

An embodiment of the present inventive concept relates to a display device including a touch sensor for multiply sensing a position and intensity of a touch.

Another embodiment of the present inventive concept relates to a display device with a reduced thickness.

Another embodiment of the present inventive concept relates to a display device with high touch sensitivity.

A display device according to an embodiment of the present inventive concept includes a display panel and a window disposed on the display panel. The window includes a first sub-window and a second sub-window and a touch sensor disposed between the first sub-window and the second sub-window.

The display device further includes a lower protective layer disposed under the display panel.

The display device further includes a bracket disposed under the display panel.

The touch sensor includes a plurality of electrodes for sensing a touch by using a capacitance sensing method.

The plurality of electrodes are formed in at least one of the first sub-window and the second sub-window.

At least one of the plurality of electrodes includes a resistance element of which at least a part is curved.

Resistance of the resistance element changes in response to pressure of the touch.

The touch sensor includes a plurality of first electrodes arranged in a first direction, a plurality of second electrodes arranged in a second direction perpendicular to the first direction to form mutual capacitance with neighboring first electrodes, a plurality of first connecting units configured to connect the plurality of first electrodes to each other, and a plurality of second connecting units configured to connect the plurality of second electrodes to each other.

At least one of the plurality of first connecting units and the plurality of second connecting units includes a zigzag-shaped resistance element.

At least one of the plurality of first connecting units and the plurality of second connecting units includes a resistance element of which at least a portion is curved.

The second sub-window includes a restorable polymeric material.

A method of manufacturing a display device according to an embodiment of the present inventive concept includes forming a first sub-window on an auxiliary substrate, forming a touch sensor on the first sub-window, forming a second sub-window on the touch sensor, and separating the auxiliary substrate from the first sub-window.

In the forming of the touch sensor, electrodes, wiring lines connected to at least one of the plurality of electrodes, and pads connected to the wiring lines are patterned on the first sub-window by a conductive material.

The method further includes electrically connecting a circuit board to the touch sensor.

The electrically connecting of the circuit board to the touch sensor includes removing one end of the first sub-window so that the pads are exposed and connecting the circuit board to the exposed pads.

The electrically connecting of the circuit board to the touch sensor includes forming a hole in the first sub-window, filling a conductive material in the hole to form a connecting unit, and connecting the circuit board to the connecting unit. The hole is formed in a position corresponding to pads of the touch sensor.

The method further includes attaching a display panel to the first sub-window by using an adhesive layer.

The second sub-window includes a restorable polymeric material.

According to the present inventive concept, it is possible to provide a display device including a touch sensor for multiply sensing a position and intensity of a touch.

In addition, it is possible to provide a display device with a small thickness.

In addition, it is possible to provide a display device with a high touch sensitivity.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
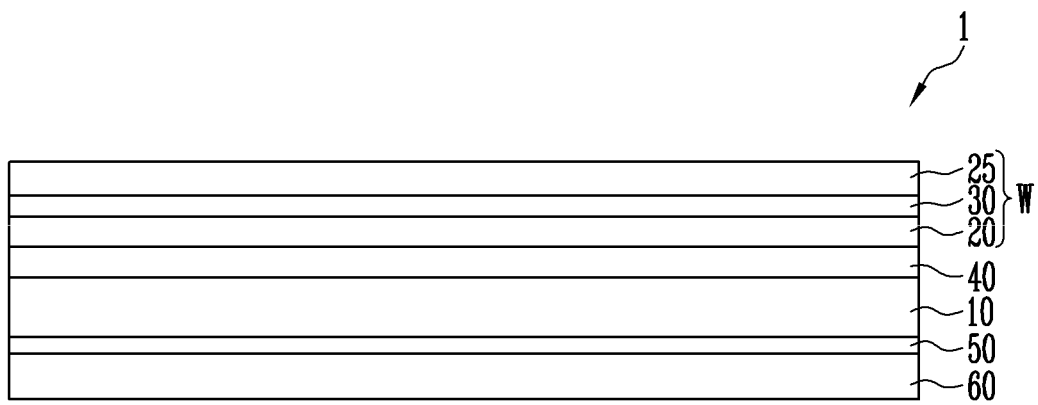
FIG. 1 is a cross-sectional view schematically illustrating a display device according to an embodiment of the present inventive concept.

Specific items of embodiments of the present inventive concept are included in the detailed description and the accompanying drawings.

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Throughout this specification and the claims that follow, when it is described that an element is "connected" to another element, the element may be "directly connected" to the other element or "electrically connected" to the other element through a third element. In the accompanying drawings, a portion irrelevant to description of the present inventive concept will be omitted for clarity. Like reference numerals refer to like elements throughout.

On the other hand, in the current specification, for convenience sake, a direction in which an image is displayed is referred to as 'an upper part' or 'a front surface direction' and the opposite direction is referred to as 'a lower part' or 'a rear surface direction'.

Hereinafter, a display device according to an embodiment of the present inventive concept and a method of manufacturing the same will be described with reference to the drawings related to the embodiments of the present inventive concept.

FIG. 1 is a cross-sectional view schematically illustrating a display device 1 according to an embodiment of the present inventive concept.

The display device 1 according to the embodiment of the present inventive concept may be flexible, stretchable, foldable, bendable, or rollable.

Referring to FIG. 1, the display device 1 according to the embodiment of the present inventive concept may include a display panel 10 and a window W.

The display panel 10 displays an image and may be disposed under the window W.

The display panel 10 and the window W may be attached by an adhesive layer 40 and the adhesive layer 40 may include a pressure sensitive adhesive (PSA), an optically clear adhesive (OCA), or an optically clear resin (OCR) as a transparent adhesive material with a high light transmittance.

The display device 1 may further include a lower protective layer 50 disposed under the display panel 10.

The lower protective layer 50 may be a polyimide (PI) film. However, the present inventive concept is not limited thereto. The lower protective layer 50 may be polyethylene terephthalate (PET), polycarbonate (PC), polymethyl methacrylate (PMMA), polyethylene naphthalate (PEN), polyethersulfone (PES), cyclic olefin copolymer (COC), a triacetylcellulose (TAC) film, a polyvinyl alcohol (PVA) film, polystyrene (PS), or K resin containing biaxially oriented PS (BOPS).

In addition, a bracket 60 disposed under the lower protective layer 50 may be further included.

Referring to FIG. 1, the window W according to the embodiment of the present inventive concept may have a multilayer structure mounted with a touch sensor 30 and may include a first sub-window 20, a second sub-window 25, and the touch sensor 30.

The first sub-window 20 may be formed of an insulating material and may have a single layer structure or a multilayer structure. In addition, the first sub-window 20 may include polyimide as a flexible material so as to be curved or folded.

In addition, the first sub-window 20 may include at least one among polystyrene, polyvinyl alcohol, polymethyl methacrylate (PMMA), polyethersulfone (PES), polyacrylate, polyetherimide, polyethylene naphthalate, polyethylene terephthalate (PET), polyphenylene sulfide, polyarylate, polycarbonate (PC), triacetate cellulose, cellulose acetate propionate, and polyurethane other than polyimide (PI).

The second sub-window 25 may be formed of an insulating material such as polymeric resin and may have a single layer structure or a multilayer structure. In addition, the second sub-window 25 may include a flexible material so as to be curved or folded.

In particular, the second sub-window 25 may include polyurethane as a material that may be restored after being transformed by pressure or scratch applied from the outside.

In addition, the second sub-window 25 may include at least one among polystyrene, polyvinyl alcohol, polymethyl methacrylate (PMMA), polyethersulfone (PES), polyacrylate, polyetherimide, polyethylene naphthalate, polyethylene terephthalate (PET), polyphenylene sulfide, polyarylate, polycarbonate (PC), triacetate cellulose, cellulose acetate propionate, and polyimide (PI) other than polyurethane.

The first sub-window 20 and the second sub-window 25 may be formed of the same material or different materials.

The touch sensor 30 according to an embodiment of the present inventive concept is disposed between the first sub-window 20 and the second sub-window 25 and may sense a position and intensity of a touch input onto the second sub-window 25.

For this purpose, the touch sensor 30 may include electrodes (not shown) for sensing a change in capacitance caused by the touch or a change in resistance caused by the intensity of the touch.

The touch sensor 30 may be formed to be separate from the first sub-window 20 and the second sub-window 25 and to be disposed between the first sub-window 20 and the second sub-window 25 or to be mounted on the first sub-window 20 or the second sub-window 25.

According to the present inventive concept, a sensor for sensing the position of the touch and a sensor for sensing the intensity of the touch are not formed on different layers and a sensor for sensing both the position and intensity of the touch is formed on a layer so that it is possible to reduce a thickness of the display device 1.

In addition, the window W and the touch sensor 30 are integrated with each other so that it is possible to reduce the thickness of the display device 1.

In addition, the touch sensor 30 is arranged in the middle of the window W so that it is possible to reduce a distance between the touch sensor 30 and a touch input object (for example, a finger of a user) and to increase touch sensitivity.

Figure 2:
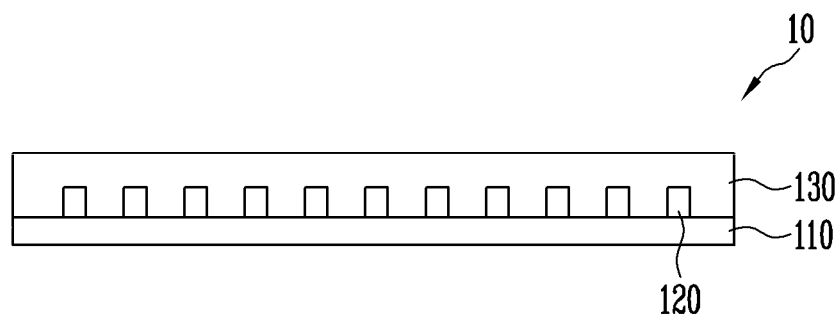
FIG. 2 is a view illustrating a display panel according to an embodiment of the present inventive concept.

FIG. 2 is a view illustrating a display panel 10 according to an embodiment of the present inventive concept.

Referring to FIG. 2, the display panel 10 according to the embodiment of the present inventive concept may include a substrate 110, pixels 120, and an encapsulation layer 130.

The plurality of pixels 120 may be disposed on the substrate 110. In addition, the encapsulation layer 130 may be disposed on the pixels 120 and the substrate 110.

For example, the substrate 110 may be formed of an insulating material such as glass or resin. In addition, the substrate 110 may include a flexible material so as to be curved or folded and may have a single layer structure or a multilayer structure.

For example, the substrate 110 may include at least one among polystyrene, polyvinyl alcohol, polymethyl methacrylate (PMMA), polyethersulfone (PES), polyacrylate, polyetherimide, polyethylene naphthalate, polyethylene terephthalate (PET), polyphenylene sulfide, polyarylate, polyimide (PI), polycarbonate (PC), triacetate cellulose, and cellulose acetate propionate.

The material that forms the substrate 110 may vary and may include fiber glass reinforced plastic (FRP).

The pixels 120 may emit light components by control of a display driver (not shown) and may be protected by the encapsulation layer 130.

For example, the encapsulation layer 130 may prevent moisture and oxygen from permeating into the pixels 120.

At this time, the encapsulation layer 130 may include at least one among glass, an organic material, and an inorganic material and may have a single layer structure or a multilayer structure.

For example, the encapsulation layer 130 may have a multilayer structure including at least one organic layer and at least one inorganic layer.

The organic layer may be formed of an organic insulating material such as polyacryl, polyimide (PI), a fluorine based carbon compound such as Teflon, polyepoxy, or benzocyclobutene and the inorganic layer may be formed of an inorganic insulating material such as polysiloxane, a silicon nitride, a silicon oxide, or a metal oxide including an aluminum oxide.

Figure 3:
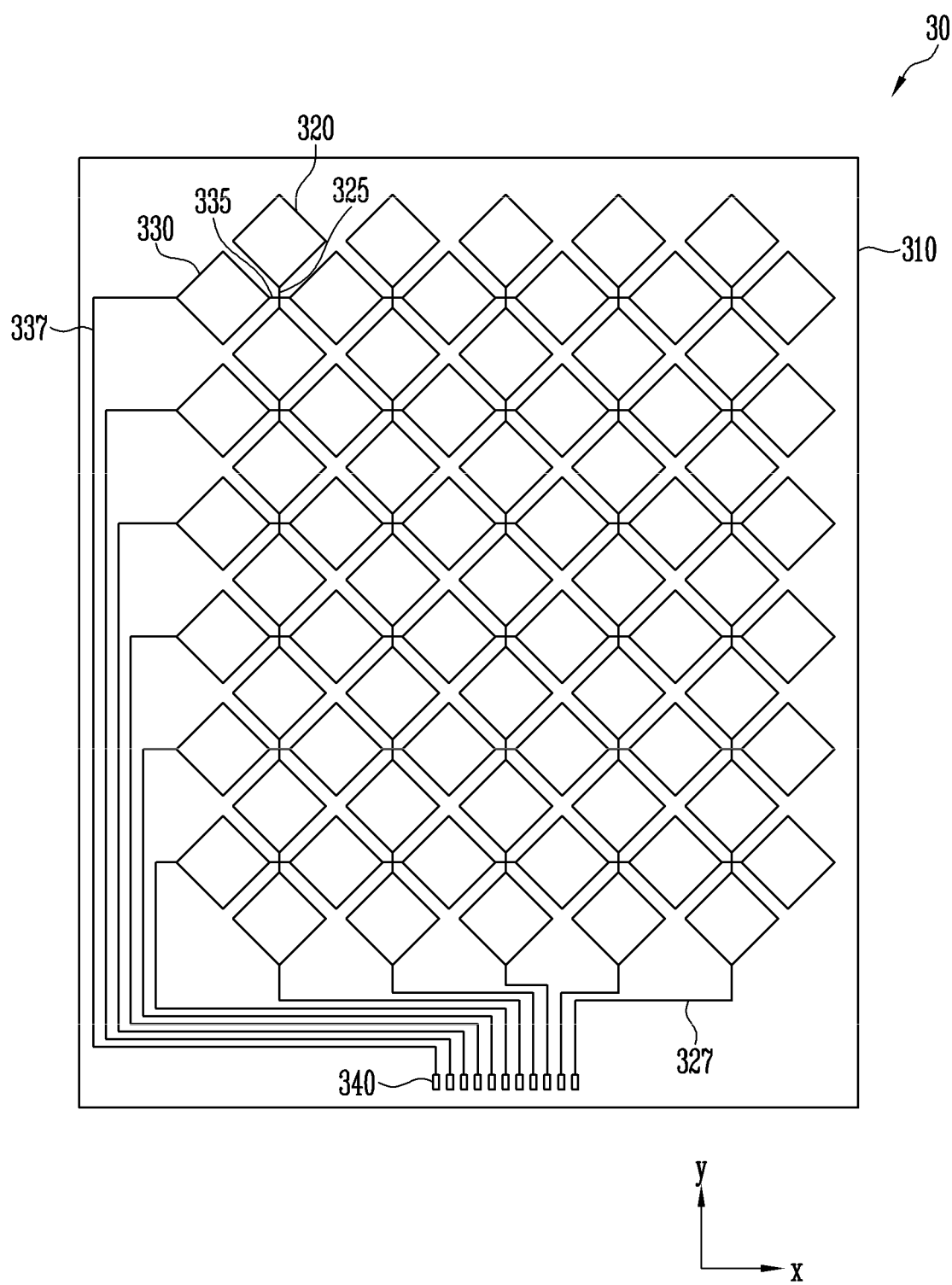
FIG. 3 is a plan view illustrating a touch sensor according to an embodiment of the present inventive concept.

FIG. 3 is a plan view illustrating a touch sensor 30 according to an embodiment of the present inventive concept.

Referring to FIG. 3, the touch sensor 30 according to the embodiment of the present inventive concept may include a substrate 310, a plurality of first electrodes 320, a plurality of second electrodes 330, a plurality of wiring lines 327 and 337, and a plurality of pads 340.

First, the substrate 310 may be formed of an insulating material such as glass or resin. In addition, the substrate 310 may include a flexible material so as to be curved or folded and may have a single layer structure or a multilayer structure.

For example, the substrate 310 may include at least one among polystyrene, polyvinyl alcohol, polymethyl methacrylate (PMMA), polyethersulfone (PES), polyacrylate, polyetherimide, polyethylene naphthalate, polyethylene terephthalate (PET), polyphenylene sulfide, polyarylate, polyimide (PI), polycarbonate (PC), triacetate cellulose, and cellulose acetate propionate.

The substrate 310 may be implemented by an additional substrate or various elements included in the display device 1. For example, the substrate 310 may be the first sub-window 20 or the second sub-window 25.

Next, the plurality of first electrodes 320 and the plurality of second electrodes 330 may be arranged on the substrate 310.

The electrodes 320 and 330 may be diamond-shaped.

The first electrodes 320 may be electrically connected by a first connecting unit 325 in a first direction (a y axis direction) and the second electrodes 330 may be electrically connected by a second connecting unit 335 in a second direction (an x axis direction).

The first electrodes 320 and the second electrodes 330 may be arranged on different layers or the same layer.

Each of the second electrodes 330 is disposed between adjacent first electrodes 320. When the first electrodes 320 and the second electrodes 330 are arranged on the same layer, in order to electrically isolate the first electrodes 320 and the second electrodes 330 from each other, a predetermined insulating material may be formed at an intersection of the first connecting unit 325 and the second connecting unit 335.

The electrodes 320 and 330 according to the embodiment of the present inventive concept sense a touch input onto the second sub-window 25, particularly, mutual capacitance by using an amount of change in capacitance.

More specifically, mutual capacitance is formed between the first electrodes 320 and the second electrodes 330 by the arrangement of the first electrodes 320 and the second electrodes 330 and, when the touch is input onto the second sub-window 25, the mutual capacitance of the electrodes 320 and 330 related to the touch changes.

The first electrodes 320 and the second electrodes 330 may include a conductive material, for example, metals, an alloy of the metals, conductive polymer, or a conductive metal oxide.

According to an embodiment of the present inventive concept, the metals may include copper (Cu), silver (Ag), gold (Au), platinum (Pt), palladium (Pd), nickel (Ni), tin (Sn), aluminum (Al), cobalt (Co), rhodium (Rh), iridium (Jr), iron (Fe), ruthenium (Ru), osmium (Os), manganese (Mn), molybdenum (Mo), tungsten (W), niobium (Nb), tantalum (Ta), titanium (Ti), bismuth (Bi), antimony (Sb), and lead (Pb). The conductive polymer may be one of a polythiophene-based compound, a polypyrole-based compound, a polyanyline-based compound, a polyacetylene-based compound, a polyphenylene-based compound, and a mixture of the above compounds. In particular, a PEDOT/PSS compound may be used as the polythiophene-based compound.

The conductive metal oxide may be indium tin oxide (ITO), indium zinc oxide (IZO), antimony zinc oxide (AZO), indium tin zinc oxide (ITZO), zinc oxide (ZnO), or tin oxide ($SnO_2$).

According to an embodiment of the present inventive concept, the electrodes 320 and 330 may be formed of a single layer or a multilayer.

The first electrodes 320 and the second electrodes 330 may be formed of the same material or different materials.

On the other hand, a shape of the electrodes 320 and 330 is not limited to that of FIG. 3 and may vary.

The first wiring lines 327 may connect the first electrodes 320 and the pads 340. In addition, the second wiring lines 337 may connect the second electrodes 330 and the pads 340. The wiring lines 327 and 337 may transmit a signal output from the electrodes 320 and 330 to the pads 340.

The pads 340 according to the present inventive concept may be connected to a sensor controller (not shown) through an additional wiring line, a flexible printed circuit board (FPCB), a tape carrier package, a connector, or a chip on film (COF).

At least one of the first electrodes 320 and the second electrodes 330 receives a driving signal from the sensor controller and at least one of the first electrodes 320 and the second electrodes 330 may output sensing signals to the sensor controller.

Therefore, the sensor controller may detect a touch position by using the sensing signals.

Figure 4A:
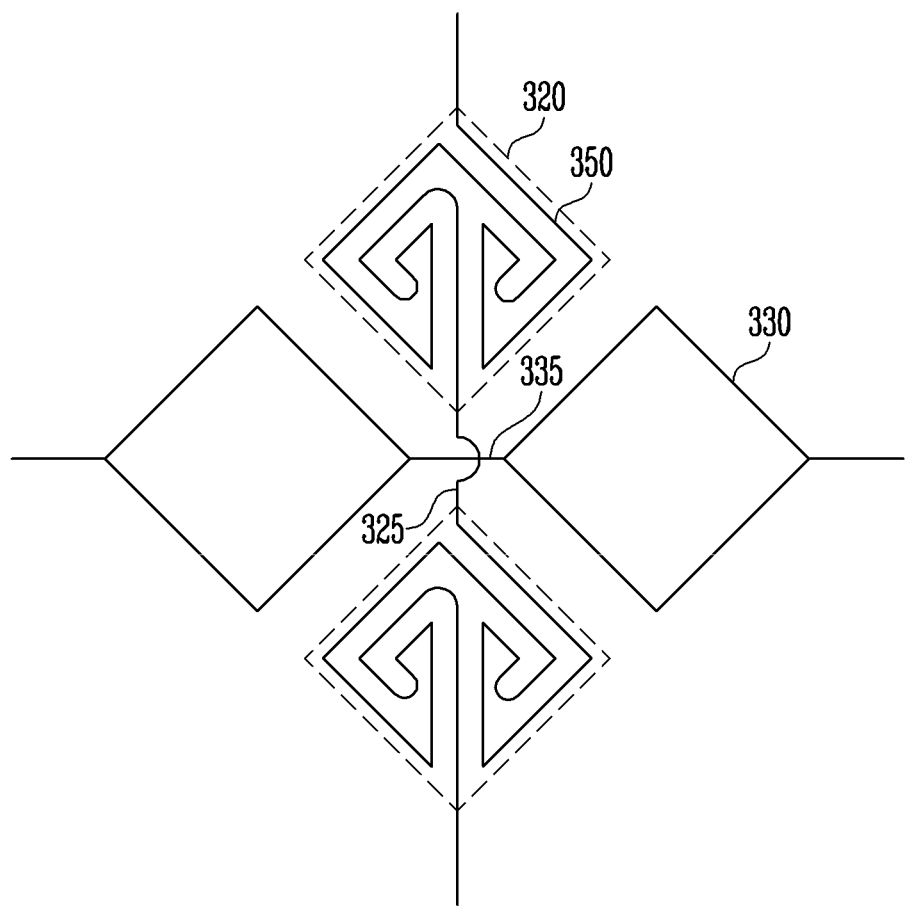
FIGS. 4A and 4B are views illustrating an enlarged part of the touch sensor of FIG. 3.

FIG. 4A illustrates a shape of electrodes according to an embodiment of the present inventive concept and is a view illustrating an enlarged portion of the touch sensor of FIG. 3. In FIG. 4A, for convenience sake, an area in which the two first electrodes 320 and the two second electrodes 330 are formed is illustrated.

The first electrode 320 according to the present inventive concept includes a resistance element 350 and the resistance element 350 may be curved with a predetermined pattern. The resistance element 350 may have a zigzag shape or a spiral shape other than the shape of FIG. 4A.

When a force with predetermined intensity is applied to the resistance element 350, a length or a cross-sectional area of the resistance element 350 changes.

Since a resistance value changes when the length or the cross-sectional area of the resistance element 350 changes, intensity of pressure may be determined by the changed resistance value.

That is, according to the present inventive concept, the first electrode 320 including the resistance element 350 operates as a strain gauge.

Specifically, when a touch is input to the display device 1, the position of the touch is obtained by an amount of change in mutual capacitance of the electrodes 320 and 330 and the intensity of the touch may be obtained by an amount of change in resistance of the first electrode 320.

Physical characteristics (a length, a cross-sectional area, a resistance value, etc.) of the resistance element 350 may be changed by pressure so that the first electrode 320 including the resistance element 350 may operate as the strain gauge and the resistance element 350 may be a line or a thin film. In addition, the resistance element 350 may include a conductive material such as metal.

The metal may be Au, Ag, Al, Mo, chrome (Cr), Ti, Ni, Nd, Cu, or Pt.

The material that forms the resistance element 350 is not limited thereto. Any material that forms mutual capacitance with a neighboring electrode and is physically transformed by pressure may form the resistance element 350 according to the present inventive concept.

On the other hand, in FIG. 4A, it is illustrated that the first electrodes 320 include the resistance elements 350. However, the present inventive concept is not limited thereto. For example, the second electrodes 330 may include the resistance elements 350, both the first electrodes 320 and the second electrodes 330 may include the resistance elements 350, or only some of the first electrodes 320 may include the resistance elements 350.

Figure 4B:
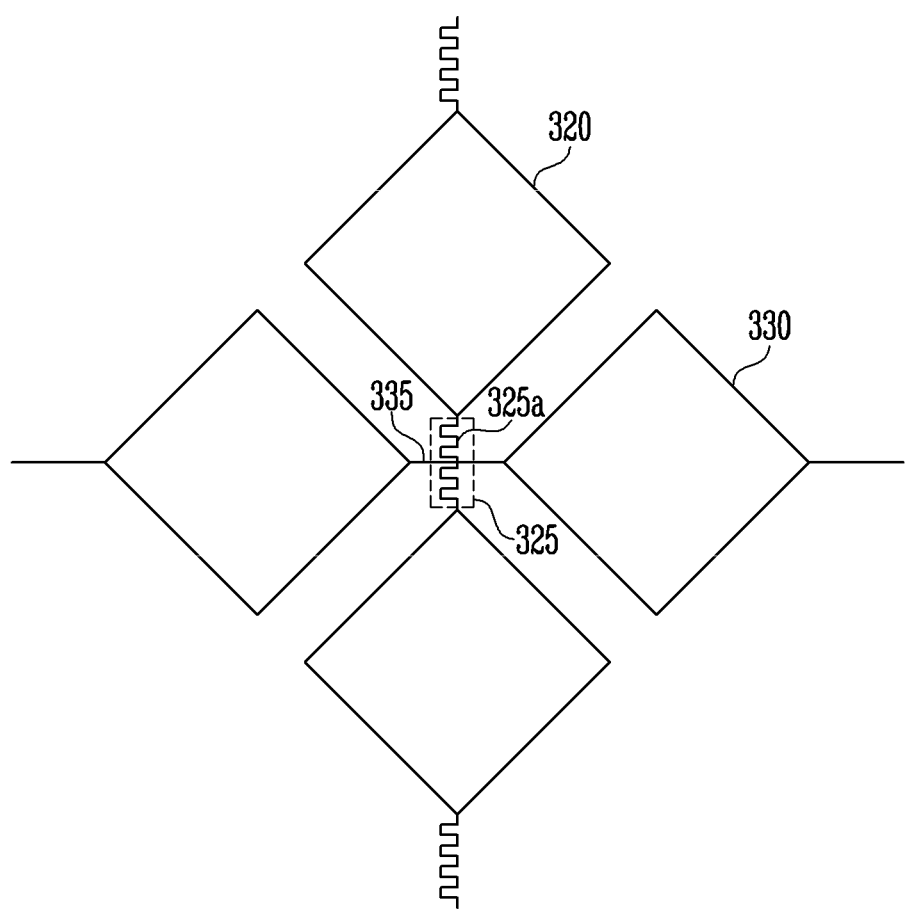

FIG. 4B illustrates a shape of electrodes according to another embodiment of the present and is a view illustrating an enlarged part of the touch sensor of FIG. 3. In FIG. 4B, for convenience sake, an area in which the two first electrodes 320 and the two second electrodes 330 are formed is illustrated.

Referring to FIG. 4B, the first connecting unit 325 for connecting the first electrodes 320 may include a resistance element 325a formed to be in zigzag.

When a force with predetermined intensity is applied to the resistance element 325a, a length or a cross-sectional area of the resistance element 325a changes.

Since a resistance value changes when the length or the cross-sectional area of the resistance element 325a changes, intensity of pressure may be determined by the changed resistance value.

That is, according to the present inventive concept, the first connecting unit 325 including the resistance element 325a operates as a strain gauge and may electrically connect the first electrodes 320 and may function as a pressure sensor.

The resistance element 325a included in the first connecting unit 325 may include the same material as the resistance element 350 illustrated in FIG. 4A.

When a touch is input to the display device 1, the position of the touch is obtained by an amount of change in mutual capacitance of the electrodes 320 and 330 and the intensity of the touch may be obtained by an amount of change in resistance of the resistance element 325a.

On the other hand, in FIG. 4B, it is illustrated that the first connecting units 325 include the resistance elements 325a. However, the present inventive concept is not limited thereto. For example, second connecting units 335 may include the resistance elements 325a, both the first connecting units 325 and the second connecting units 335 may include the resistance elements 325a, or only some of the first connecting units 325 may include the resistance elements 325a.

In order to measure resistance of the resistance element 350, one end of each of the first electrodes 320 to which the first wiring lines 327 are not connected and one end of each of the second electrodes 330 to which the second wiring lines 337 are not connected may be connected to a reference power source (for example, a ground voltage power source).

FIGS. 5 through 11 are views illustrating a method of manufacturing a display device according to an embodiment of the present inventive concept.

Figure 5:
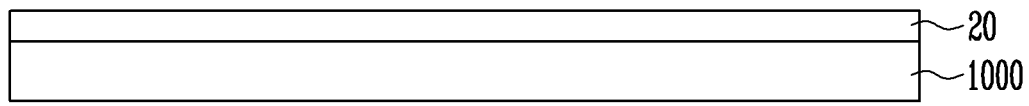
FIGS. 5, 6, 7, 8, 9, 10 and 11 are views illustrating a method of manufacturing a display device according to an embodiment of the present inventive concept.

First, referring to FIG. 5, the first sub-window 20 is formed on an auxiliary substrate 1000. The auxiliary substrate 1000 may be a glass substrate and the first sub-window 20 may be formed by coating a material with transparency, insulation property, and flexibility on the auxiliary substrate 1000 and hardening the coated material. Since the material that forms the first sub-window 20 is described above, detailed description thereof will not be given.

The first sub-window 20 may be formed on a front surface of the auxiliary substrate 1000 to a uniform thickness.

Figure 6:
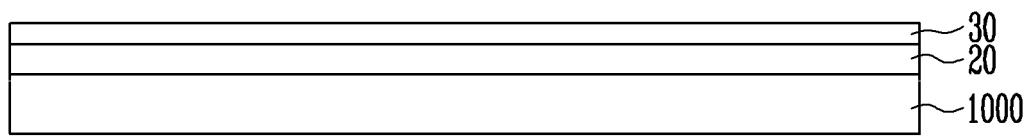

Referring to FIG. 6, the touch sensor 30 may be formed on the first sub-window 20.

In this case, the touch sensor 30 may be formed on the first sub-window 20. The touch sensor 30 may be formed of a conductive material by patterning the same electrodes, wiring lines, and pads as illustrated in FIGS. 3 through 4B (or FIGS. 15A and 15B).

As occasion demands, the touch sensor 30 which is formed by a separate procedure may be attached onto the first sub-window 20.

Figure 7:
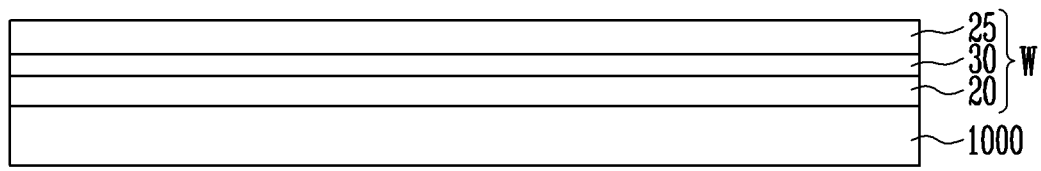

Referring to FIG. 7, the second sub-window 25 may be formed on the touch sensor 30.

The second sub-window 25 may be formed by coating a material with transparency, insulation property, and flexibility on the touch sensor 30 and hardening the coated material. Since the material that forms the second sub-window 25 is described above, detailed description thereof will not be given.

Figure 8:
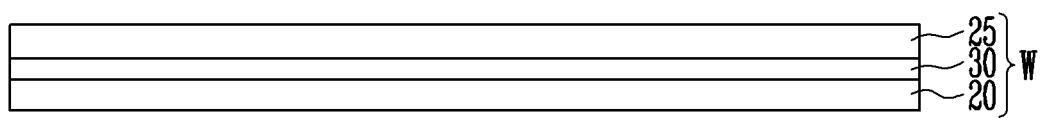

Referring to FIG. 8, when the window W including the first sub-window 20, the touch sensor 30, and the second sub-window 25 is formed on the auxiliary substrate 1000, the auxiliary substrate 1000 may be separated and removed from the window W.

The auxiliary substrate 1000 may be removed by using a laser ablation technique.

Figure 9:
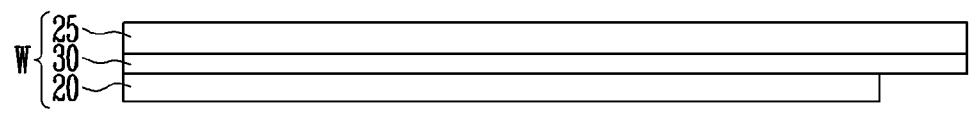

Referring to FIG. 9, one end of the first sub-window 20 may be removed so that the pads provided in the touch sensor 30 are exposed.

The one end of the first sub-window 20 may be removed by a beam irradiated from laser.

Figure 10:
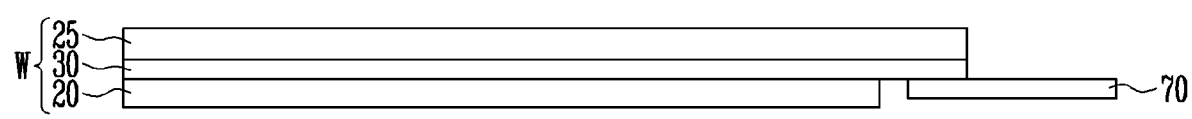

Referring to FIG. 10, a first circuit board 70 for driving the touch sensor 30 may be connected to the touch sensor 30.

In particular, the pads of the touch sensor 30 and pads (not shown) of the first circuit board 70 may be connected to each other so that the touch sensor 30 and the first circuit board 70 may be electrically connected to each other. In addition, the first circuit board 70 may be a flexible printed circuit board (FPCB).

Figure 11:
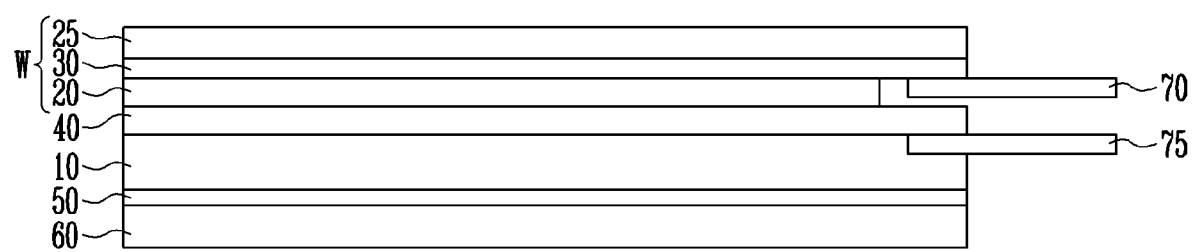

Referring to FIG. 11, the display panel 10 may be attached to the first sub-window 20 by the adhesive layer 40.

A second circuit board 75 for driving the display panel 10 may be connected to the display panel 10 before attachment of the first sub-window 20 to the display panel and the second circuit board 75 may be a FPCB.

On the other hand, as illustrate din FIG. 11, the display panel 10 to which the lower protective layer 50 and the bracket 60 are attached may be attached to the first sub-window 20.

As occasion demands, after the display panel 10 is attached to the first sub-window 20, the lower protective layer 50 and the bracket 60 may be sequentially formed.

Figure 12:
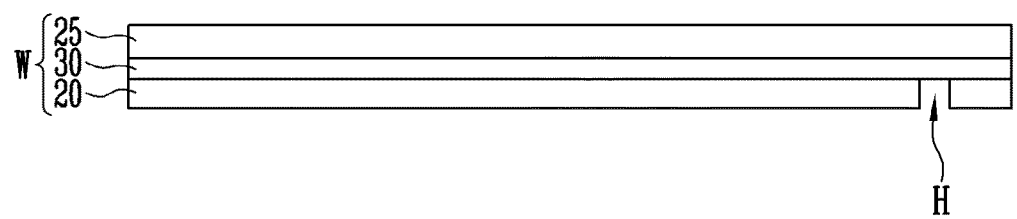
FIGS. 12, 13 and 14 are views illustrating a method of manufacturing a display device according to another embodiment of the present inventive concept.
Figure 13:
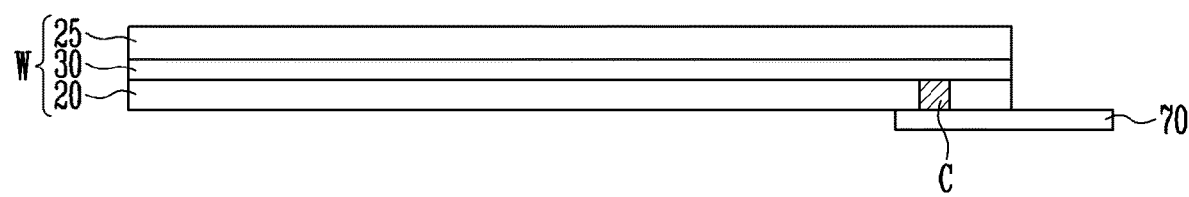
Figure 14:
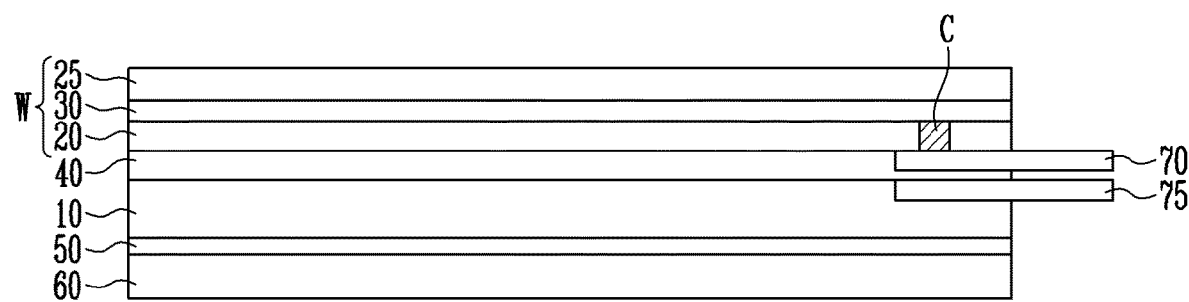

FIGS. 12 through 14 are views illustrating a method of manufacturing a display device according to another embodiment of the present inventive concept, particularly, a method of electrically connecting the touch sensor 30 and the first circuit board 70 according to another embodiment of the present inventive concept.

First, the window including the first sub-window 20, the second sub-window 25, and the touch sensor 30 is formed according to the embodiment related to FIGS. 5 through 8.

Next, as illustrated in FIG. 12, a hole H may be formed in the first sub-window 20. In particular, the hole H may be formed in a position corresponding to the pads of the touch sensor 30.

The hole H may be formed by removing a part of the first sub-window 20 by the beam irradiated from the laser.

Referring to FIG. 13, a conductive material may be filled in the hole H so that a connecting unit C is formed in the first sub-window 20.

The conductive material may be metals, an alloy of the metals, conductive polymer, or a conductive metal oxide.

Then, the first circuit board 70 for driving the touch sensor 30 may be connected to the connecting unit C. The first circuit board 70 may be electrically connected to the touch sensor 30 by the connecting unit C. The above-described sensor controller may be mounted in the first circuit board 70.

Referring to FIG. 14, the display panel 10 may be attached to the first sub-window 20 by the adhesive layer 40.

The second circuit board 75 for driving the display panel 10 may be connected to the display panel 10 before attachment of the first sub-window 20 to the display panel and the second circuit board 75 may be the FPCB. The above-described display driver may be mounted in the second circuit board 75.

Figure 15A:
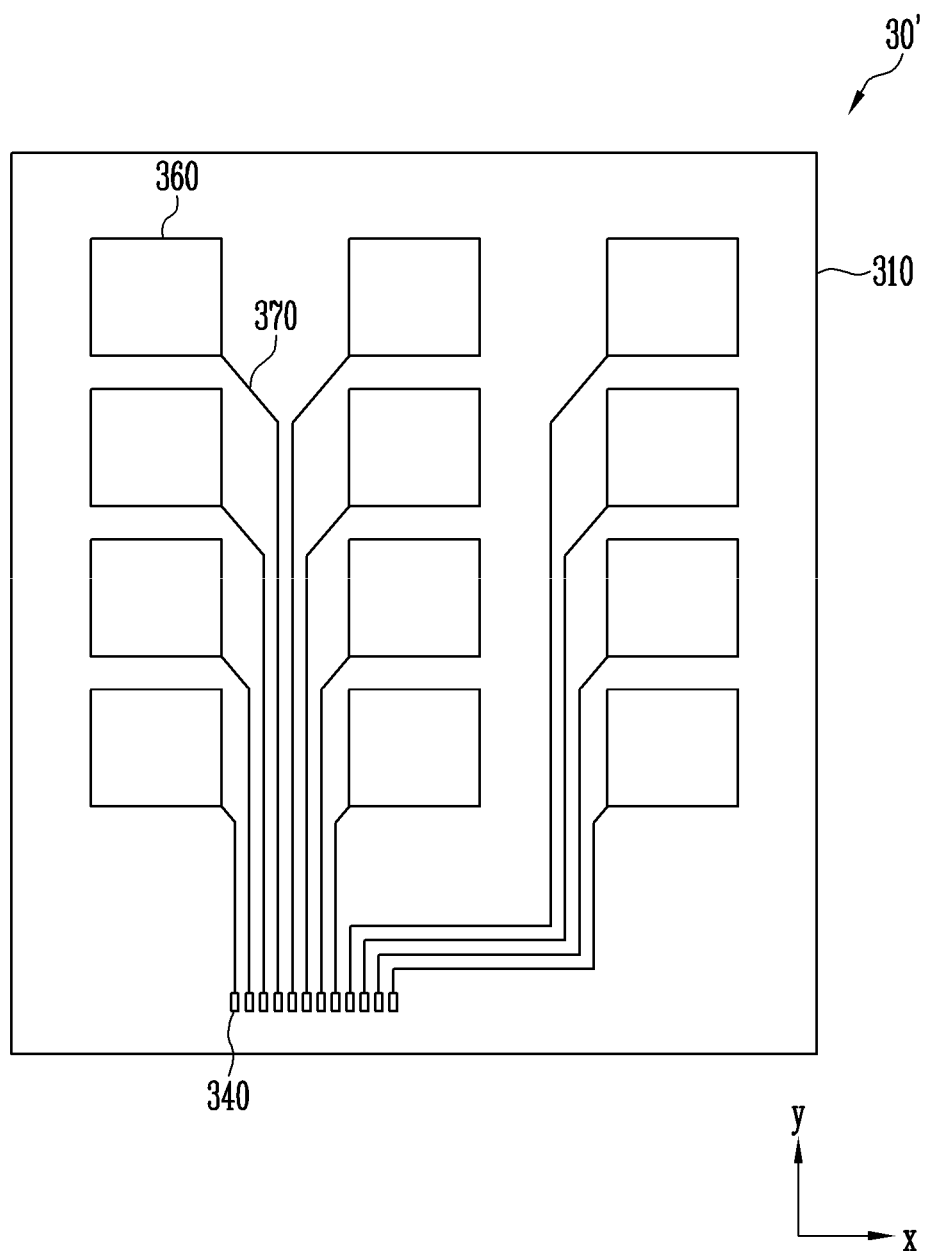
FIG. 15A is a plan view illustrating a touch sensor according to another embodiment of the present inventive concept.
Figure 15B:
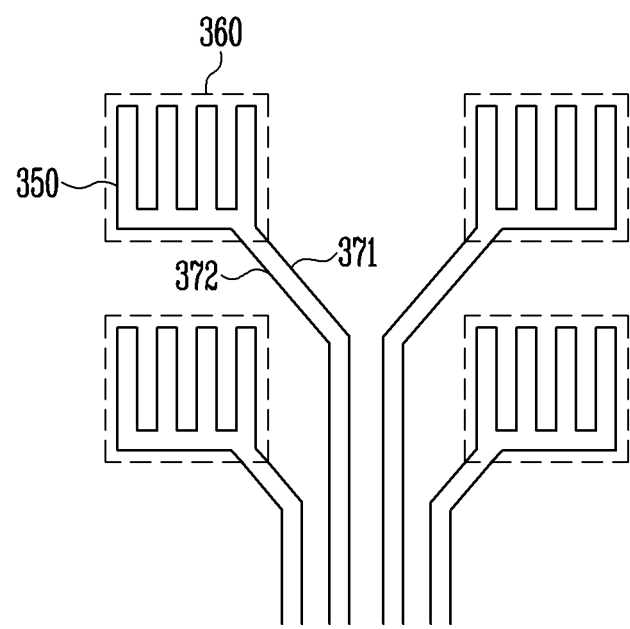
FIG. 15B is a view illustrating an enlarged part of the touch sensor of FIG. 15A.

FIG. 15A is a plan view illustrating a touch sensor 30' according to another embodiment of the present inventive concept. FIG. 15B is a view illustrating an enlarged part of the touch sensor of FIG. 15A.

Referring to FIG. 15A, the touch sensor 30' according to another embodiment of the present inventive concept may include the substrate 310, a plurality of electrodes 360, a plurality of wiring lines 370, and the plurality of pads 340.

First, since the substrate 310 may be implemented by the substrate 310 illustrated in FIG. 3, detailed description thereof will not be given.

The plurality of electrodes 360 may be arranged on the substrate 310. Specifically, the plurality of electrodes 360 may be arranged in a matrix so that the plurality of electrodes 360 are arranged in the x axis direction and a plurality of electrode rows arranged in the x axis direction are provided in the y axis direction.

The plurality of electrodes 360 according to an embodiment of the present inventive concept are for sensing a touch, in particular, self-capacitance by using an amount of change in capacitance.

The plurality of electrodes 360 may be formed of the same material as the first electrodes 320 or the second electrodes 330 illustrated in FIGS. 3 through 4B.

In FIG. 15A, it is illustrated that the electrodes 360 are square. However, the present inventive concept is not limited thereto. As occasion demands, a shape of the electrodes 360 may vary. The number of electrodes 360 provided on the substrate 310 may vary.

The plurality of wiring lines 370 may be connected between the plurality of electrodes 360 and the plurality of pads 340. Specifically, the wiring lines 370 respectively extend from the corresponding electrodes 360 in the y axis direction and may be electrically connected to the pads 340.

The plurality of wiring lines 370 may transmit a signal output from the plurality of electrodes 360 to the plurality of pads 340. The signal may include a signal corresponding to the amount of change in capacitance of the electrodes and the amount of change in resistance of the resistance element to be described later.

On the other hand, in FIG. 15A, it is illustrated that the plurality of electrodes 360 and the plurality of wiring lines 370 are formed on the same layer. However, the present inventive concept is not limited thereto. For example, the plurality of electrodes 360 and the plurality of wiring lines 370 may be formed on different layers. In this case, the plurality of electrodes 360 and the plurality of wiring lines 370 may be electrically connected to each other through a contact hole.

Since the pads 340 according to the present inventive concept may be implemented by the pads 340 illustrated in FIG. 3, detailed description thereof will not be given.

When a touch is input to the display device 1, since self-capacitance of the electrodes 360 related to the touch changes, the sensor controller may detect a touch position by using the signal output from the electrodes 360.

Referring to FIG. 15B, the electrode 360 according to the embodiment of the present inventive concept includes the resistance element 350 and at least a portion of the resistance element 350 may be curved. For example, the resistance element 350 may include a zigzag-shaped portion.

In addition, in order to obtain the resistance of the resistance element 350, a wiring line may include a first wiring line 371 and a second wiring line 372.

Since the resistance element 350 may be implemented by the resistance element 350 illustrated in FIG. 4A, detailed description thereof will not be given.

That is, when a touch is input to the display device 1, a position of the touch is obtained by the amount of change in self-capacitance of the electrodes 360 and intensity of the touch may be obtained by the amount of change in resistance of the resistance elements 350 since the resistance elements 350 operate as strain gauges.

On the other hand, in FIG. 15B, it is illustrated that the electrodes 360 respectively include the resistance elements 350. However, the present inventive concept is not limited thereto. For example, the resistance elements 350 may be included in only some of the electrodes 360.

In addition, the resistance element 350 may be included in the wiring lines 371 and 372 connected to the electrode 360 other than in the electrode 360.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. A method of manufacturing a display device, the method comprising:
    forming a first transparent layer on an auxiliary substrate;
    forming a touch sensor on the first transparent layer;
    forming a second transparent layer on the touch sensor;
    separating the auxiliary substrate from the first transparent layer;
    forming a hole in the first transparent layer;
    filling a conductive material in the hole to form a connecting unit; and
    connecting a circuit board to the connecting unit to electrically connect the circuit board to the touch sensor,
    wherein the touch sensor comprises first electrodes adjacent to second electrodes in a plan view,
    wherein the hole is formed in a position corresponding to pads of the touch sensor,
    wherein the second transparent layer is a window exposed to an outside of the display device,
    wherein an area of the touch sensor is greater than a total area of the first transparent layer.

2. The method of claim 1, wherein, in the forming of the touch sensor, electrodes, wiring lines connected to at least one of the electrodes, and the pads connected to the wiring lines are patterned on the first transparent layer by a conductive material.

3. The method of claim 1, further comprising attaching a display panel to the first transparent layer by using an adhesive layer.

4. The method of claim 1, wherein the second transparent layer comprises a restorable polymeric material.

5. The method of claim 1, wherein separating the auxiliary substrate from the first transparent layer comprises using laser ablation.

6. The method of claim 1, wherein each of the first electrodes comprises a strain gauge.

\* \* \* \* \*